(12) United States Patent
Hou

(10) Patent No.: US 12,575,093 B2
(45) Date of Patent: Mar. 10, 2026

(54) ANTI-FUSE STRUCTURE, ANTI-FUSE ARRAY AND METHOD FOR MANUFACTURING SAME

(71) Applicant: CHANGXIN MEMORY TECHNOLOGIES, INC., Hefei City (CN)

(72) Inventor: Chuangming Hou, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 441 days.

(21) Appl. No.: 18/165,011

(22) Filed: Feb. 6, 2023

(65) Prior Publication Data

US 2023/0422493 A1 Dec. 28, 2023

Related U.S. Application Data

(63) Continuation of application No. PCT/CN2022/105529, filed on Jul. 13, 2022.

(30) Foreign Application Priority Data

Jun. 27, 2022 (CN) .......................... 202210741019.6

(51) Int. Cl.
*H10B 20/25* (2023.01)
(52) U.S. Cl.
CPC ..................................... *H10B 20/25* (2023.02)
(58) Field of Classification Search
CPC ..................................................... H10B 20/25
See application file for complete search history.

(56) References Cited

U.S. PATENT DOCUMENTS

| | | | | |
|---|---|---|---|---|
| 9,443,860 B1 | 9/2016 | Sung | | |
| 9,589,971 B1 | 3/2017 | Chang | | |
| 9,601,499 B2 * | 3/2017 | Wu | ......................... | G11C 17/16 |
| 10,332,873 B2 * | 6/2019 | Ishii | ..................... | H10D 84/401 |
| 10,964,708 B2 | 3/2021 | Sreeramaneni | | |
| 2017/0053707 A1 | 2/2017 | Liao | | |

(Continued)

FOREIGN PATENT DOCUMENTS

| | | |
|---|---|---|
| CN | 103745977 B | 9/2016 |
| CN | 106067459 A | 11/2016 |

(Continued)

*Primary Examiner* — Allison Bernstein
(74) *Attorney, Agent, or Firm* — Syncoda LLC; Feng Ma

(57) ABSTRACT

Provided is an anti-fuse structure, an anti-fuse array and a method for forming the same. The anti-fuse structure includes: a substrate; a switching device including a first gate structure, a second gate structure, a first doped region, a second doped region and a third doped region, the first and the second gate structures being arranged on the substrate, the first and the second doped regions being respectively located in the substrate at two sides of the first gate structure, and the second and the third doped regions being respectively located in the substrate at two sides of the second gate structure; and an anti-fuse device including a third gate structure and the third doped region, the second and the third gate structures being respectively located on the substrate at two sides of the third doped region, and the doped regions being configured to form a source or a drain, respectively.

15 Claims, 12 Drawing Sheets

(56)  References Cited

U.S. PATENT DOCUMENTS

2017/0054300 A1    2/2017  Shao et al.
2018/0204843 A1    7/2018  Son
2019/0221572 A1    7/2019  Son

FOREIGN PATENT DOCUMENTS

CN            106469726 A      3/2017
CN            108336058 A      7/2018
CN            113496988 A     10/2021

* cited by examiner

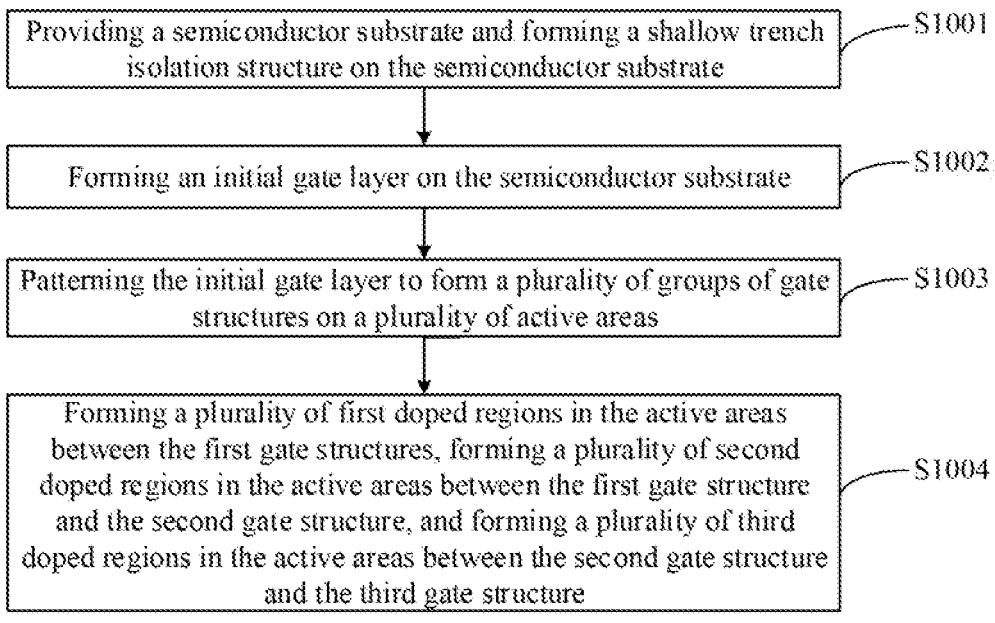

| Providing a semiconductor substrate and forming a shallow trench isolation structure on the semiconductor substrate | — S1001 |

| Forming an initial gate layer on the semiconductor substrate | — S1002 |

| Patterning the initial gate layer to form a plurality of groups of gate structures on a plurality of active areas | — S1003 |

| Forming a plurality of first doped regions in the active areas between the first gate structures, forming a plurality of second doped regions in the active areas between the first gate structure and the second gate structure, and forming a plurality of third doped regions in the active areas between the second gate structure and the third gate structure | — S1004 |

FIG. 13

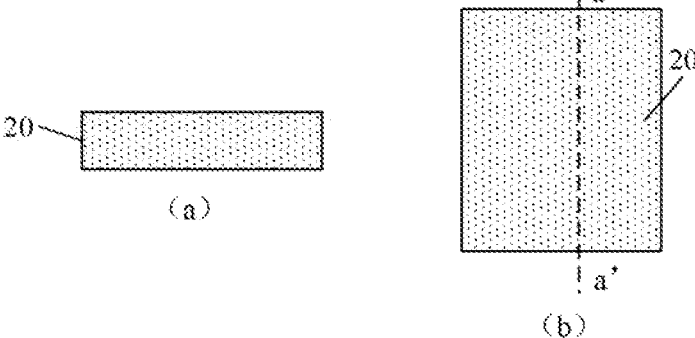

ANTI-FUSE STRUCTURE, ANTI-FUSE ARRAY AND METHOD FOR MANUFACTURING SAME

CROSS-REFERENCE TO RELATED APPLICATIONS

This application is a continuation application of International Application No. PCT/CN2022/105529, filed on Jul. 13, 2022, which claims priority to Chinese Patent Application No. 202210741019.6, filed on Jun. 27, 2022. The disclosures of International Application No. PCT/CN2022/105529 and Chinese Patent Application No. 202210741019.6 are hereby incorporated by reference in their entirety.

BACKGROUND

There are usually redundant memory cells in a dynamic random access memory (DRAM) chip. When the DRAM chip generates defective memory cells, these redundant memory cells can replace the defective memory cells to repair the DRAM. When repairing the DRAM chip, one-time programming devices, such as anti-fuse devices, will be used.

An anti-fuse array includes programming transistors, selective transistors, and bit lines. When a high voltage is applied to the programming gate of the programming transistor, the gate oxide layer of the programming gate is damaged due to the voltage difference between the high-voltage of the programming gate and the low-voltage of the bit line. Specifically, a voltage sufficient to form a conductive channel is applied to the selective gate of the selective transistor, to transmit the programming gate voltage. Then, the voltage difference between the programming gate and the bit line acts on the gate oxide layer, thereby causing the gate oxide layer of the programming gate to be destroyed to complete the programming operation.

SUMMARY

The disclosure relates to the technical field of integrated circuits, in particular to an anti-fuse structure, an anti-fuse array and a method for manufacturing the same.

In the first aspect, embodiments of the disclosure provide an anti-fuse structure including a substrate, a switching device and an anti-fuse device.

The switching device includes a first gate structure, a second gate structure, a first doped region, a second doped region and a third doped region, in which the first gate structure and the second gate structure are arranged on the substrate, the first doped region and the second doped region are respectively located in the substrate at two sides of the first gate structure, and the second doped region and the third doped region are respectively located in the substrate at two sides of the second gate structure The anti-fuse device includes a third gate structure and the third doped region, in which the second gate structure and the third gate structure are respectively located on the substrate at two sides of the third doped region. The doped regions are respectively configured to form.

In the second aspect, embodiments of the disclosure provide an anti-fuse array, which includes multiple anti-fuse sub-arrays and N bit lines.

The multiple anti-fuse sub-arrays arranged along a first direction, in which each of the anti-fuse sub-arrays includes two anti-fuse unit rows, each of the anti-fuse unit rows includes N anti-fuse structures described in any of the first aspect, where N is an integer greater than or equal to 1; the two anti-fuse unit rows are axially symmetrically arranged along a symmetry axis extending parallel to a second direction, the N anti-fuse structures of each anti-fuse unit row are spaced apart from each other along the second direction, and the first gate structures, the second gate structures and the third gate structures of the N anti-fuse structures are respectively connected and extend along the second direction.

The N bit lines extend along the first direction and are spaced apart from each other along the second direction, and each of the bit lines is electrically connected to the first doped regions spaced apart from each other along the first direction in the multiple anti-fuse sub-arrays.

In the third aspect, embodiments of the disclosure provide a method for manufacturing an anti-fuse structure, which includes the following operations.

A semiconductor substrate is provided, and a shallow trench isolation structure is formed on the semiconductor substrate, in which the shallow trench isolation structure divides the semiconductor substrate into a plurality of active areas arranged in an array.

An initial gate layer is formed on the semiconductor substrate.

The initial gate layer is patterned to form a plurality of groups of gate structures on the plurality of active areas, in which each group of gate structures includes a pair of first gate structures symmetrically arranged at two sides of a symmetry axis, a pair of second gate structures symmetrically arranged at two sides of the pair of first gate structures, and a pair of third gate structures symmetrically arranged at two sides of the pair of second gate structures, and the symmetry axis, the first gate structures, the second gate structures and the third gate structures respectively extend along the second direction, and each group of gate structures covers a plurality of the active areas arranged along the second direction.

A plurality of first doped regions are formed in the active areas between the first gate structures, a plurality of second doped regions are formed in the active areas between the first gate structure and the second gate structure, and a plurality of third doped regions are formed in the active areas between the second gate structure and the third gate structure.

In the fourth aspect, embodiments of the disclosure provide a semiconductor memory including the anti-fuse array as described in any of the second aspect.

BRIEF DESCRIPTION OF THE DRAWINGS

FIG. 13 is a flow chart showing a method for manufacturing an anti-fuse array provided by an embodiment of the disclosure;

FIG. 14 is a schematic structural diagram of a substrate provided by an embodiment of the disclosure;

DETAILED DESCRIPTION

Figure 1:
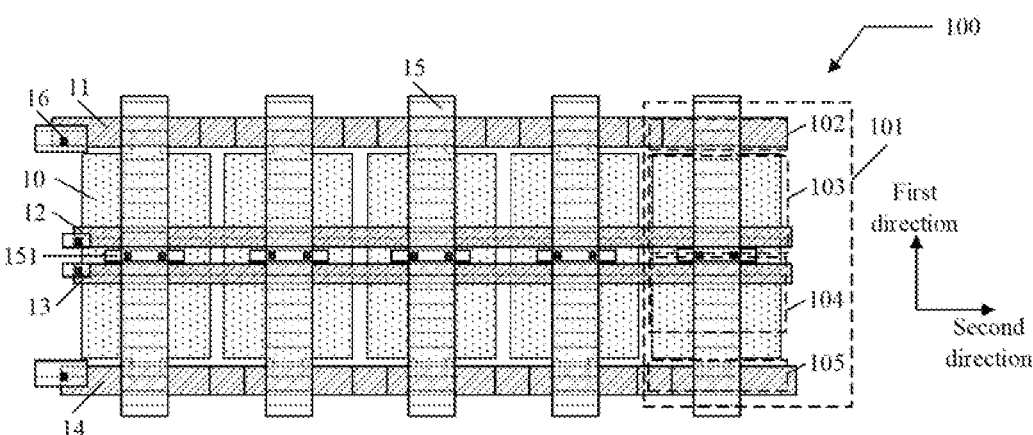
FIG. 1 is an array arrangement diagram of an anti-fuse array.

A clear and complete description of the technical solutions of the embodiments of the disclosure will be provided below with reference to the drawings in the embodiments of the disclosure. It could be understood that the specific embodiments described herein are intended only to explain the relevant disclosure and not to limit the disclosure. In addition, it should be noted that for convenience of description, only parts related to the relevant disclosure are shown in the drawings.

Unless otherwise defined, all technical and scientific terms used herein have the same meanings as are commonly understood by those skilled in the art of the present disclosure. Terms used herein are for the purpose of describing embodiments of the disclosure only and are not intended to limit the disclosure.

In the following description, reference is made to "some embodiments" that describe a subset of all possible embodiments, but it could be understood that "some embodiments" may be the same subset or different subsets of all possible embodiments and may be combined with each other without conflict.

It should be pointed out that, the terms "first\second\third" involved in embodiments of the disclosure is used only to distinguish similar objects, without representing a particular sequence of objects, it could be understood that "first\second\third" may be interchanged in a particular order or priority order where permitted, so that the embodiments of the disclosure described herein can be implemented in an order other than that illustrated or described herein.

FIG. 1 is an array arrangement diagram of an anti-fuse array 100. As shown in FIG. 1, the anti-fuse array 100 includes a plurality of array cells 101 spaced apart from each other and arranged in the second direction. Each of the array cells includes a first anti-fuse device 102, a first switching device 103, a second switching device 104, and a second anti-fuse device 105. Herein, the gate of the first anti-fuse device 102 is the first anti-fuse gate 11, the gate of the first switching device 103 is the first switching gate 12, the gate of the second anti-fuse device 105 is the second anti-fuse gate 14, and the gate of the second switching device 104 is the second switching gate 13. As shown in FIG. 1, the first anti-fuse gates 11 of the array cells 101 are connected together, the first switching gates 12 of the array cells 101 are connected, the second anti-fuse gates 14 of the array cells 101 are connected, and the second switching gates 13 of the array cells 101 are connected, and they all extend in the second direction.

In the substrate 10, the source of the first switching device 103 and the second switching device 104 is formed in an active area 10 located between the first switching gate 12 and the second switching gate 13, that is, the first switching device 103 and the second switching device 104 in each array cell 101 share one same source; the active area 10 located between the first switching gate 12 and the first anti-fuse gate 11 forms the drain of the first switching device 103. The active area 10 located between the second switching gate 13 and the second anti-fuse gate 14 forms the drain of the second switching device 104.

As shown in FIG. 1, the anti-fuse array 100 further includes a plurality of bit lines 15 extending in the first direction. Each of the bit lines is electrically connected to the source in the active area 10 by a bit line connecting structure 151, on which contact plugs 16 is provided to realize electrical connection between different layers. In addition, the anti-fuse array 100 may include multiple contact plugs 16 for connecting each gate to a word line, a power supply or the like.

In the anti-fuse array 100 shown in FIG. 1, the first anti-fuse device 102 and the first switching device 103 constitute one programming unit, and the second anti-fuse device 105 and the second switching device 104 also constitute one programming unit. That is, a programming unit includes an anti-fuse device and a switching device. When programming (writing), a high voltage (about 5.5~6 volts) is applied to the anti-fuse gate, 0 V is set at the corresponding bit line end, and the corresponding switching device is turned on, so that the thin gate oxide of the anti-fuse device is broken down under the high voltage and the resistance is significantly reduced, thus achieving the purpose of writing.

Figure 2:
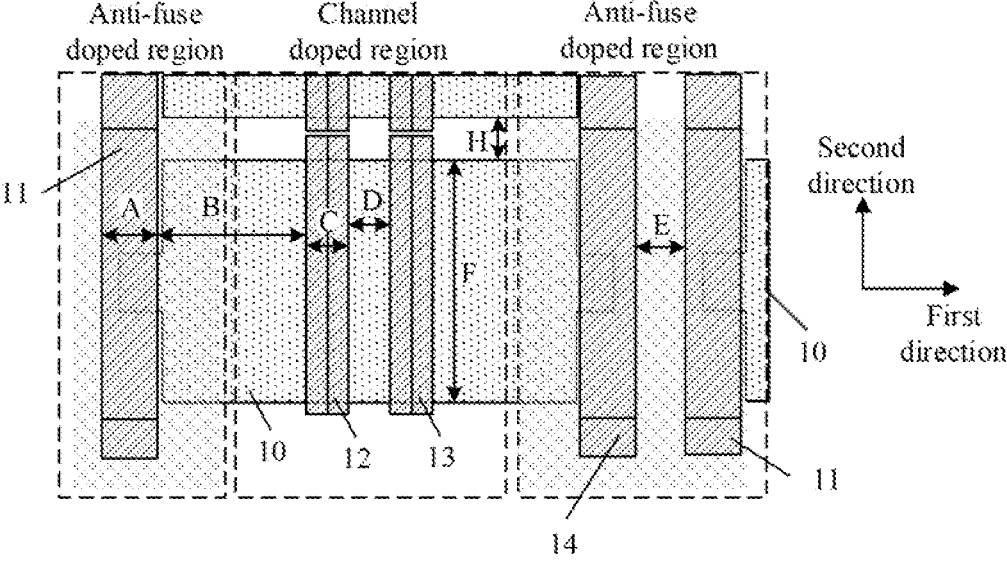
FIG. 2 is a schematic diagram of a local structure of an anti-fuse array provided by an embodiment of the disclosure.

With the decrease of the size of chips, the area of the anti-fuse array must be reduced as well, for saving precious space for memory array. Reference is made to FIG. 2, which shows a schematic diagram of a local detailed structure of an anti-fuse array. As shown in FIG. 2, the widths of the first anti-fuse gate 11 and the second anti-fuse gate 14 are both A; the spacing distance between the adjacent first anti-fuse gate 11 and first switching gate 12 is B, and the spacing distance between the adjacent second anti-fuse gate 14 and second switching gate 13 is also B; the widths of the first switch gate 12 and the second switching gate 13 are both C; the spacing distance between the adjacent first switching gate 12 and second switching gate 13 is D; and the spacing distance between the adjacent active areas 10 is H in the first direction, and the spacing distance between the adjacent active areas 10 is E in the second direction.

Taking FIG. 2 as an example, in the anti-fuse array, the switching device is a thick gate oxide device, the gate of which has a longer length, and a large device width (i.e., the width C of the first switching gate 12 and the second switching gate 13) is required to make the switching device have sufficient current driving capability. In addition, due to the design rules and the requirements of semiconductor manufacturability, the arrangement of the channel doped region (CH) of a switching device and the anti-fuse doped region (AF) of an anti-fuse device that has a higher concentration make the anti-fuse gate and the selective gate have to keep a large distance. As a result, the area of the anti-fuse array is difficult to be further reduced, and the uneven arrangement of the gates will also have a great impact on the performance of the devices (such as layout parasitic effect and uneven doping problem).

Based on this, embodiments of the disclosure provide an anti-fuse structure, which includes a substrate; a switching device including a first gate structure, a second gate structure, a first doped region, a second doped region and a third doped region, in which the first gate structure and the second gate structure are arranged on the substrate, the first doped region and the second doped region are respectively located in the substrate at two sides of the first gate structure, and the second doped region and the third doped region are respectively located in the substrate at two sides of the second gate structure; and an anti-fuse device including a third gate structure and the third doped region, in which the second gate structure and the third gate structure are respectively located on the substrate at two sides of the third doped region, and the doped regions are used for forming a source or a drain. In this way, the switching device includes two gate structures and three doped regions, which is equivalent to form two switching transistors. Accordingly, when programming, the two switching transistors share the high voltage at the same time, which avoids the problem that the switching device is avalanche broken down caused by a high voltage applied on the switching device after the anti-fuse device is broken down, and improves the reliability and stability of the switching device. In addition, since the switching device includes three doped regions, and a voltage drop is present in the three doped regions when the switching device is turned on, the voltage at the second doped region is higher than that at the substrate, because of the substrate bias effect, the turn-on voltage of the switching device increases, which further avoids the possibility of breakdown of the switching device.

The embodiments of the disclosure will be described in detail below with reference to the drawings.

Figures 3, 4:
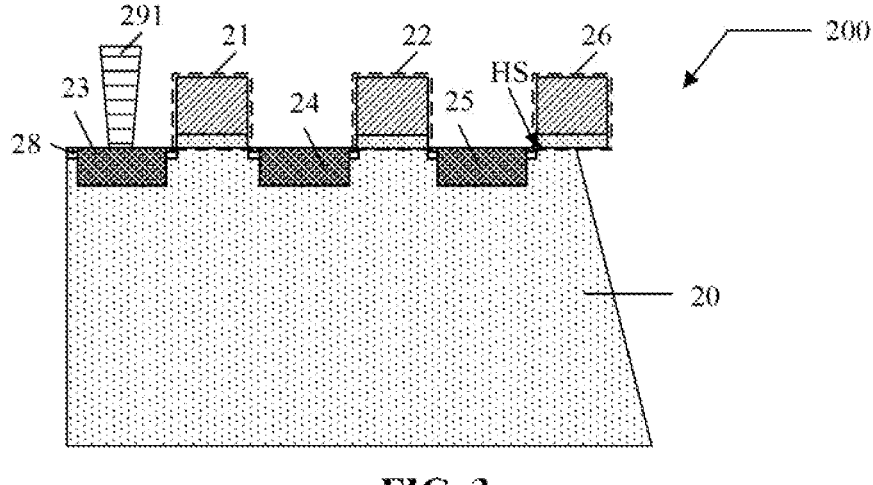
FIG. 3 is a schematic diagram of the composition of an anti-fuse structure provided by an embodiment of the disclosure.
FIG. 4 is a schematic diagram of the composition of another anti-fuse structure provided by an embodiment of the disclosure.

In an embodiment of the disclosure, referring to FIG. 3, it is a schematic diagram of the composition of an anti-fuse structure 200 provided by an embodiment of the disclosure. As shown in FIG. 3, the anti-fuse structure 200 may include a substrate 20, a switching device and an anti-fuse device.

The switching device includes a first gate structure 21, a second gate structure 22, a first doped region 23, a second doped region 24 and a third doped region 25, in which the first gate structure 21 and the second gate structure 22 are arranged on the substrate 20, the first doped region 23 and the second doped region 24 are respectively located in the substrate at two sides of the first gate structure 21, and the second doped region 24 and the third doped region 25 are respectively located in the substrate 20 at two sides of the second gate structure.

The anti-fuse device includes a third gate structure 26 and the third doped region 25, in which the second gate structure 22 and the third gate structure 26 are respectively located on the substrate 20 at two sides of the third doped region 25.

The doped regions are used for forming a source or a drain.

It should be noted that, the anti-fuse unit provided by the embodiments of the disclosure includes a switching device (also referred to as a switching transistor, a selective device, a selective transistor or the like, which may be denoted by XADD) and an anti-fuse device (also referred to as an anti-fuse transistor, a programming device, an anti-fuse transistor or the like, which may be denoted by AF). As shown in FIG. 3, both the switching device and the anti-fuse device are formed on the substrate 20, specifically in an active area of the substrate 20. In FIG. 3, the substrate 20 mainly shows the active area part, i.e. the first doped region 23, the second doped region 24, and the third doped region 25 are all formed in the active area of the substrate 20. Herein, the first gate structure 21, the second gate structure 22, the first doped region 23, the second doped region 24 and the third doped region 25 constitute the switching device, and the third gate structure 26 and the third doped region 25 constitute the anti-fuse device.

It should also be noted that, referring to FIG. 4, it is a schematic diagram of the composition of another anti-fuse structure 100 provided by an embodiment of the disclosure. As shown in FIG. 4, the first doped region 23 and the first gate structure 21, the second doped region 24, the second gate structure 22 and the third doped region 25 on the right side of the first doped region 23 constitute one switching device (may be referred to as a first switching device), and the third gate structure 26 and the third doped region 25 on the right side of the first switching device constitute one anti-fuse device (may be referred to as a first anti-fuse device). The first doped region 23 and the first gate structure 21, the second doped region 24, the second gate structure 22 and the third doped region 25 on the left side of the first doped region 23 constitute another switching device (which may be referred to as a second switching device), the third gate structure 26 and the third doped region 25 on the left side of the second switching device constitute another anti-fuse device (which may be referred to as a second anti-fuse device).

That is, in this embodiment of the disclosure, a pair of switching devices on the left and right sides are symmetrically arranged on the substrate 20 and share the first doped region 23. Herein, the first doped region 23, the second doped regions 24 and the third doped regions 25 form the source and the drains of the first switching device and the second switching device. For example, the first doped region 23 forms the source of the first switching device and also the source of the second switching device; the second doped region 24 and the third doped region 25 on the right form the drains of the first switching device, and the second doped region 24 and the third doped region 25 on the left form the drains of the second switching device. In addition, the first doped region 23 can also be used as a drain, and the second doped regions 24 and the third doped regions 25 can also be used as sources, which can be determined according to actual use requirements.

In this way, since the switching device includes two gate structures and three doped regions, which is equivalent to two switching transistors, when programming by the anti-fuse structure, the two switching transistors can share the high voltage, thus avoiding the breakdown of the switching device.

Figure 5:
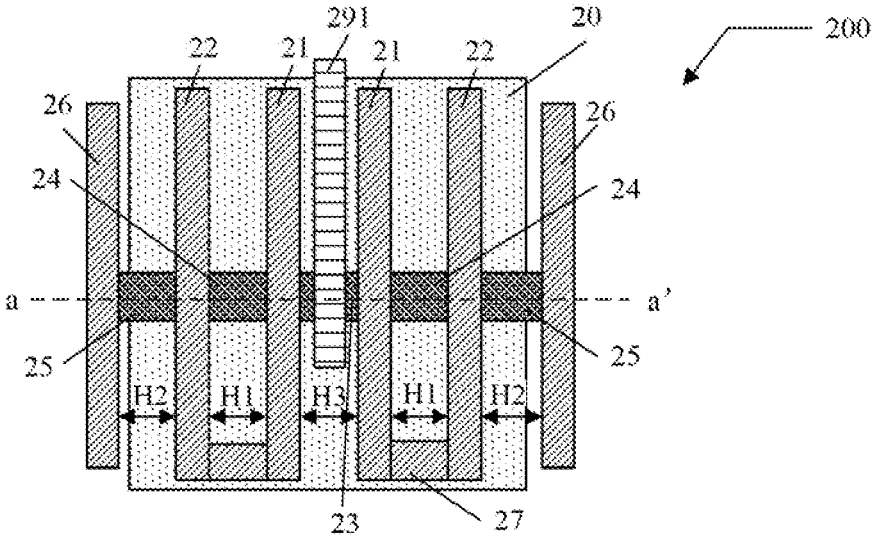
FIG. 5 is a schematic diagram of the layout structure of an anti-fuse structure provided by an embodiment of the disclosure.

Reference is made to FIG. 5, which is a schematic diagram of the layout structure of an anti-fuse structure provided by an embodiment of the disclosure. Herein, FIG. 4 is a schematic cross-sectional view along aa' direction in FIG. 5;

As shown in FIG. 5, in some embodiments, the spacing distance between the first gate structure 21 and the second gate structure 22 is the same as the spacing distance between the second gate structure 22 and the third gate structure 26.

It should be noted that, as shown in FIG. 5, in the anti-fuse structure 200, the spacing distance between the first gate structure 21 and the second gate structure 22 is H1, the spacing distance between the second gate structure 22 and the third gate structure 26 is H2, and the distance between the two first gate structures 21 is H3. In the embodiments of the disclosure, since anti-fuse doped regions are omitted from regions corresponding to the anti-fuse devices in the active area, there is no need to consider the effect of an anti-fuse doped region, and the gate structures of the switching devices (the first gate structure and the second gate structure) can be closer to the gate structures of the anti-fuse devices. Therefore, H1, H2 and H3 are equal, and the widths of the first gate structure, the second gate structure and the third gate structure can also be equal. That is, in the anti-fuse structure, the spacing distances of any adjacent gate structures are equal, and the sizes of the first doped region 23, the second doped region 24, and the third doped region 25 in the active area between the gate structures are also equal.

In this way, since the spacing distances between adjacent gate structures are the same, the arrangement of the anti-fuse structure is neat and beautiful, which can improve the pattern uniformity of the layout, and is beneficial to the actual process production and reduces the area of the devices.

Further, in some embodiments, for each gate structure, as shown in FIG. 4, the first gate structure 21 includes a first gate conductive layer 211 and a first gate oxide layer 212, the second gate structure 22 includes a second gate conductive layer 221 and a second gate oxide layer 222, and the third gate structure 26 includes a third gate conductive layer 261 and a third gate oxide layer 262.

The first gate oxide layer 212 is formed between the first gate conductive layer 211 and the substrate 20.

The second gate oxide layer 222 is formed between the second gate conductive layer 221 and the substrate 20.

The third gate oxide layer 262 is formed between the third gate conductive layer 261 and the substrate 20.

It should be noted that, as shown in FIG. 4, each gate structure is composed of a gate conductive layer and a gate oxide layer (also referred to as a gate dielectric layer). The gate oxide layer is formed between the substrate 20 and the gate conductive layer. In this way, when programming, a high voltage is applied to the gate conductive layers of the anti-fuse device and the adjacent switching device to turn on the switching device, and the gate oxide layer (the third gate oxide layer 262) of the anti-fuse device is broken down and the resistance is significantly reduced. The anti-fuse devices without applying a high voltage are in a high resistance state since the gate oxide layers are not broken down, thus achieving the purpose of writing. Herein, the high voltage can be 5.6~6 volts (V).

Further, as shown in FIG. 5, in some embodiments, the first gate structure 21 and the second gate structure 22 are connected to form a bent gate.

It should be noted that, in the embodiment of the disclosure, the first gate structure 21 and the second gate structure 22 are connected, the connection mode may be a bent connection (or "U"-shaped connection) as shown in FIG. 5. Specifically, as shown in FIG. 5, the first gate structure 21 and the second gate structure 22 may be connected by a gate connecting structure 27. The gate connecting structure 27 may be composed of a gate conductive connecting layer and a gate oxide connecting layer similar to those of the gate structures. The gate conductive connecting layer is of the same material as each gate conductive layer described above and is connected with the first gate conductive layer and the second gate conductive layer. The gate oxide connecting layer is of the same material as each gate oxide layer and is connected with the first gate oxide layer and the second gate oxide layer.

That is, the first gate structure 21, the second gate structure 22 and the gate connecting structure 27 jointly constitute the gate of the switching device, which are integrated and can be formed simultaneously in one process during manufacture without being divided into three parts. In the embodiment of the disclosure, the gate of the switching device is divided into three parts only for convenience of description.

Figure 6:
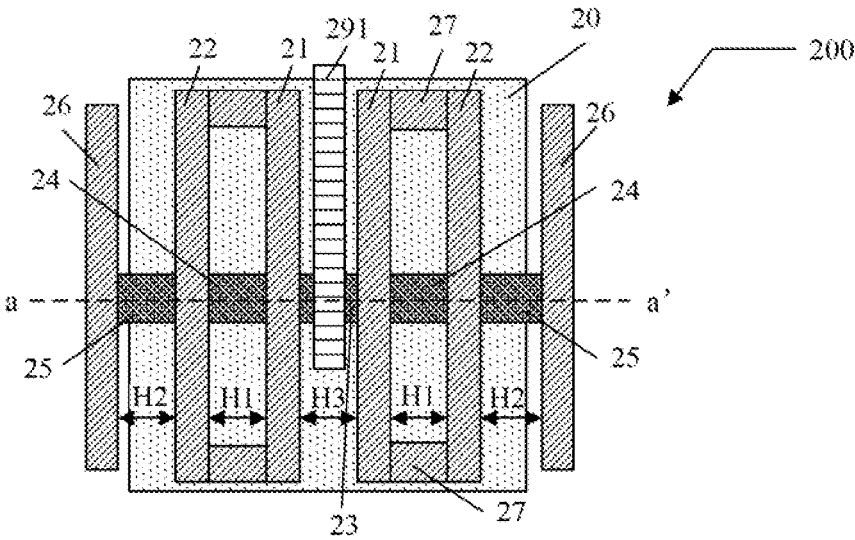
FIG. 6 is a schematic diagram of the layout structure of another anti-fuse structure provided by an embodiment of the disclosure.

In addition, FIG. 6 shows a schematic diagram of the layout structure of another anti-fuse structure provided by an embodiment of the disclosure. As shown in FIG. 6, in some embodiments, the first gate structure 21 and the second gate structure 22 are connected to form an annular gate.

It should be noted that, the difference between FIG. 6 and FIG. 5 is that the connection mode of the first gate structure 21 and the second gate structure 22 is different, and the rest parts are the same, which will not be repeated here. In FIG. 5, the gate connecting structure 27 connects the first gate structure 21 and the second gate structure 22 at an end to form a bent gate. Here, the gate connecting structure 27 and the first gate structure 21 and the second gate structure 22 are integrated, and they are separated into several parts for convenience of description only. In FIG. 6, the gate connecting structures 27 are present at both ends of the first gate structure 21 and the second gate structure 22 so as to connect the first gate structure 21 and the second gate structure 22 to form an annular gate.

In some embodiments, the first gate oxide, the second gate oxide, and the third gate oxide have the same thickness.

It should be noted that, based on the anti-fuse structure provided by the embodiment of the disclosure, the thicknesses of the gate oxide layers of the gate structures are the same, that is, both the anti-fuse device and the switching device are thin gate oxide devices.

As for the doped regions, in some embodiments, the first doped region forms a source of the switching device. The second doped region and the third doped region form a first drain and a second drain of the switching device, respectively.

In some embodiments, as shown in FIG. 3 or FIG. 4, the anti-fuse structure further includes lightly doped drain regions 28, in which the lightly doped drain regions 28 are formed on both sides of the first doped region 23, on both sides of each second doped region 24, and on both sides of each third doped region 25.

It should be noted that, in the embodiments of the disclosure, the switching device is not only a double gate structure but also a double drain structure. As shown in FIG. 4, the first doped region 23 forms the source of the switching device, the second doped region 24 forms the second drain of the switching device and the third doped region 25 forms the first drain of the switching device. Specifically, the first doped region 23 (source), the first gate structure 21, and the second doped region 24 (second drain) may constitute one switching transistor, and the first doped region 23 (source), the second gate structure 22, and the third doped region 25 (first drain) may constitute another switching transistor. In this way, when the anti-fuse device is broken down, the two switching transistors can share the high voltage at the same time, the turn-on voltage of the switching transistors become larger, which leads to the increase of the channel resistance, so that the series current to the channels of the two switching transistors through the third gate structure is limited, and the potential differences between the drain and the sources of the switching transistors are greatly reduced, thereby greatly reducing the possibility of complete breakdown of the switching devices.

In the substrate 20, lightly doped drains 28 (LDD) are also formed on both sides of each doped region. Herein, the lightly doped drain regions 28 can weaken the drain electric field in the transistors, thus improving a series of short channel effects such as hot electron degradation effect.

As shown in FIG. 3 or FIG. 4, in some embodiments, the anti-fuse structure 200 further includes a bit line connecting structure 291 that electrically connects the bit line to the first doped region 23.

It should be noted that, with reference to FIG. 5 or FIG. 6, the bit line connecting structure is formed on the first doped region 23 for electrically connecting the first doped region 23 to the bit line.

Figure 7:
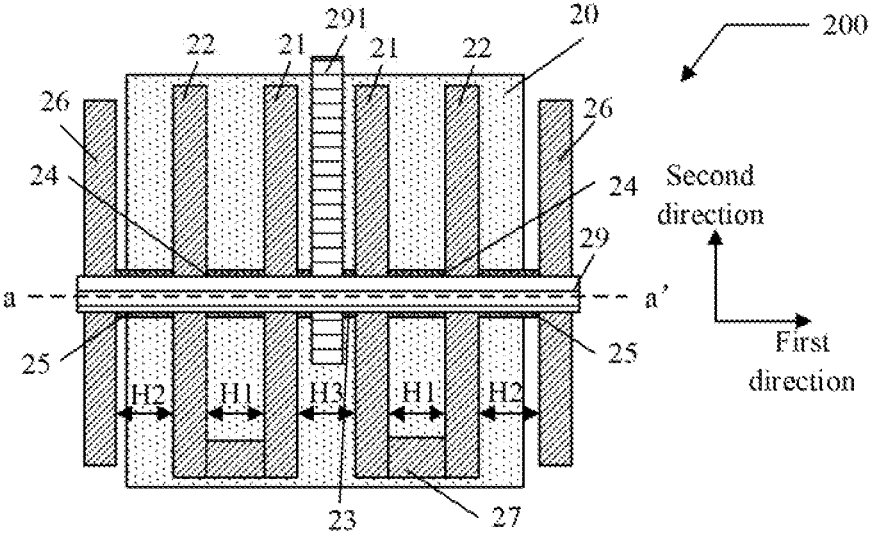
FIG. 7 is a schematic diagram of the layout arrangement of yet another anti-fuse structure provided by an embodiment of the disclosure.

Reference is made to FIG. 7, which shows a schematic diagram of the layout arrangement of yet another anti-fuse structure provided by an embodiment of the disclosure, which is a structure after adding a bit line 29 on the basis of FIG. 5. As shown in FIG. 7, each gate structure extends in the second direction and the bit line 29 extends in the first direction. Herein, the bit line connecting structure 291 electrically connects the bit line 29 to the first doped region 23 and therefore the bit line connecting structure 291 can also be regarded as a part of the bit line 29.

In some embodiments, the anti-fuse structure may also include a word line connected to the gate conductive layer of each gate structure, so that a high voltage is applied to each gate structure through the word line to turn on the selected switching device and break down the selected anti-fuse device.

Figure 8:
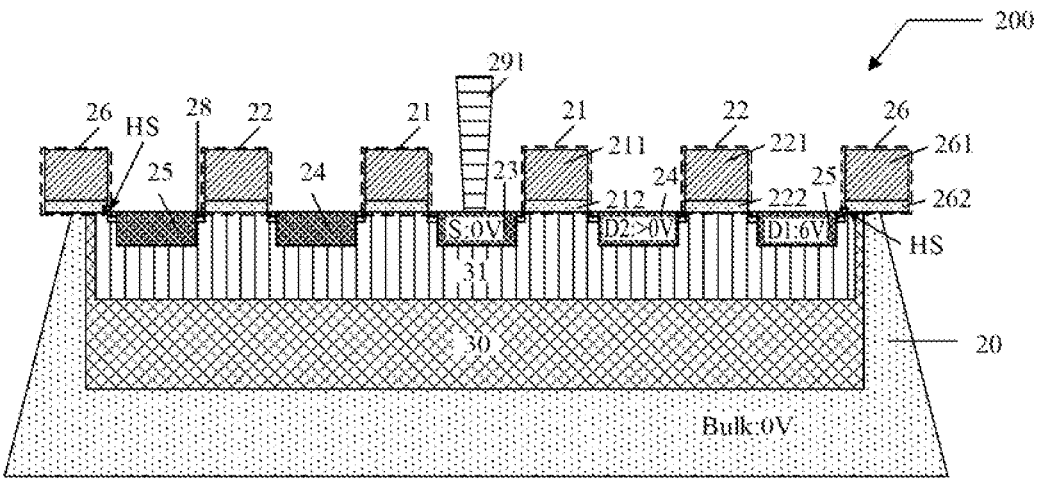
FIG. 8 is a schematic diagram of the composition of yet another anti-fuse structure provided by an embodiment of the disclosure.

Further, reference is made to FIG. 8, which shows a schematic diagram of the composition of another anti-fuse structure 200 provided by an embodiment of the disclosure.

As shown in FIG. 8, in some embodiments, a well region 30 is provided in the substrate 20.

The first doped region 23, the second doped region 24, and the third doped region 25 are formed in the well region 30.

The first gate structure 21, the second gate structure 22, and the third gate structure 26 are formed on the well region.

It should be noted that, the well region 30 may be obtained by P-type ion implantation on the active area. As shown in FIG. 8, further P-type ion implantation on the well region 30 may also result in a channel layer 31 which may also be referred to as a channel doped region. That is, in the embodiments of the disclosure, only the channel doped region, i.e. the channel layer 31 is required to be form by ion implantation, and no anti-fuse doped region is necessarily formed.

In this way, an anti-fuse doped region is omitted in the active area corresponding to the anti-fuse device. Therefore, the spacing distance between the anti-fuse gate structure (the third gate structure) and the switching gate structures (the first gate structure and the second gate structure) can be reduced, and the device length of the switching device can be reduced, such that the device width of the switching device can be greatly reduced without changing the current driving capability. When forming an anti-fuse array, the area of the anti-fuse array can be greatly reduced.

Figures 9, 10:
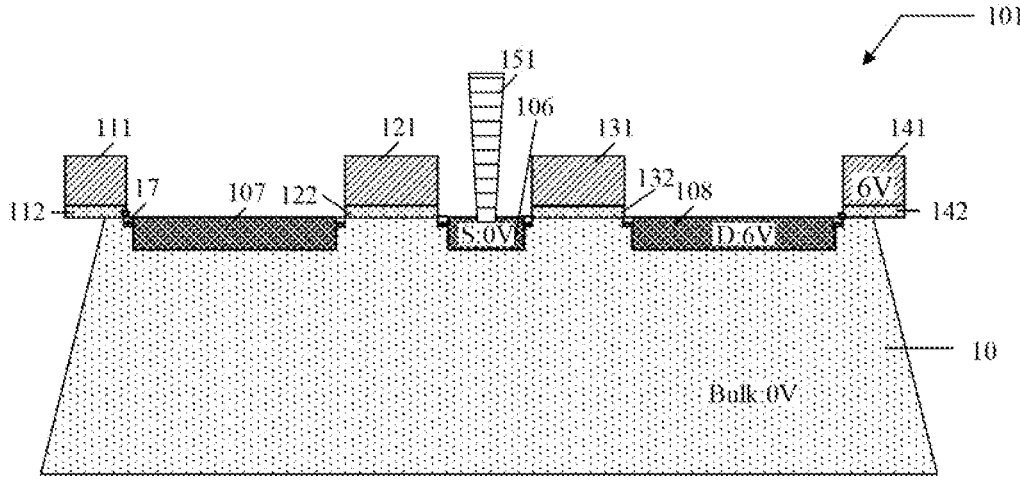
FIG. 9 is a schematic diagram of the composition of an anti-fuse structure.
FIG. 10 is a schematic diagram of the array arrangement of an anti-fuse array provided by an embodiment of the disclosure.

FIG. 9 is a schematic diagram of the composition of an anti-fuse structure 101 corresponding to an array unit 101 in FIG. 1. As shown in FIG. 9, the anti-fuse structure 101 includes two switching devices and two programming devices, lightly doped drain regions 17 and a bit line connecting structure 151 formed on the substrate 10 (the substrate 10 mainly refers to the active area 10). The first switching gate includes a gate conductive layer 121 and a gate oxide layer 122, the second switching gate includes a gate conductive layer 131 and a gate oxide layer 132, the first anti-fuse gate includes a gate conductive layer 111 and a gate oxide layer 112, and the second anti-fuse gate includes a gate conductive layer 141 and a gate oxide layer 142. The doped region 106 forms a source (S in the figure) and both of the doped region 107 and the doped region 108 form drains (D in the figure).

Herein, the first switching gate, the doped region 106 and the doped region 107 constitute a first switching device, the first anti-fuse gate and the doped region 107 constitute a first anti-fuse device, the second switching gate, the doped region 106 and the doped region 108 constitute a second switching device, and the second anti-fuse gate and the doped region 108 constitute a second anti-fuse device.

Comparing FIG. 9 and FIG. 8, taking the breakdown voltage of 6V as an example, in the structure shown in FIG. 9, when the anti-fuse device is broken down, the drain of the switching device connected with the gate of the anti-fuse device has a high voltage of 6V, and the switching device is in a saturated state at this time. In the strong electric field of the pinch-off region (depletion region) of the channel of the switching device, collision of carriers will occur, which will multiply the ionization, and the generated holes will flow into the substrate end (shown with Bulk in the figure). Although the substrate end is externally connected with a voltage of 0V, the substrate end has certain resistance, and the inflow of holes will increase the potential of the local substrate near the channel of the switching device, which causes the positive bias of the PN junction from the substrate to the source end, aggravates the collision ionization multiplication, and finally causes the complete breakdown of the switching device. In the anti-fuse structure provided by the embodiments of the disclosure, as shown in FIG. 8 (where D1 denotes a first drain and D2 denotes a second drain), the switching device includes two gate structures and two drains. In this way, 0V of the source end (denoted by S) is connected through two switching transistors. Since both the two switching transistors are in a turn-on state, there is a series current from D1 to D2 and then to S, due to the voltage drop, the voltage of D2 is a value greater than 0V, and the voltage of Bulk at the substrate end is 0V. That is, the switching transistor composed of the second drain D2/the second gate structure 22 and the first drain D1 has a certain negative substrate bias. The turn-on voltage of the switching transistor increases, resulting in the increase the channel resistance, which limits the series current from the gate of the anti-fuse device to the two channels of the switching device. In addition, the potential difference from the drain ends to the source end of the switching device in this structure is greatly reduced. These two factors greatly reduce the possibility of complete breakdown.

It can be seen that, based on the anti-fuse structure provided by the embodiments of the disclosure, the double thin gate oxide device can be used as the switching device, and two switching transistors in the switching device share the high voltage at the same time, thus avoiding the avalanche breakdown of the switching device caused by the high voltage falling on the drain end of the switching device after the anti-fuse device is broken down.

In addition, as shown in FIG. 8, an anti-fuse doped region is omitted from an active area corresponding to the anti-fuse device of the embodiments of the disclosure, such that the high voltage is only concentrated on the overlapping edge of the lightly doped drain region (the lightly doped drain region can be N-type doped, abbreviated as NLDD) and the gate structure (the third gate structure) of the anti-fuse device, which limits the hot spot region when the gate oxide is broken down, and improves the uniformity of the anti-fuse structure. Herein, the specific locations of the hot spots are indicated by HS in FIG. 3/FIG. 4/FIG. 8. In the structure shown in FIG. 9, due to the existence of the anti-fuse doped region, the drain end of the switching device and the anti-fuse doped region are connected together. That is, the voltage at the region where the drain end of the switching device and the anti-fuse doped region overlap is 0V, thus when breakdown, hot spots can be formed in anywhere of the overlapping region. At the same time, due to the high doping concentration in the anti-fuse doped region, the spacing distance between the gate structure of the anti-fuse device and the gate structure of the switching device is large, which is not conducive to the uniformity of the anti-fuse device. That is, compared with the structure shown in FIG. 9, the anti-fuse structure provided by the embodiments of the disclosure is much improved in all aspects, and not only the anti-fuse device is not easy to be broken down, but also the uniformity is good.

Embodiments of the disclosure provide an anti-fuse structure, which includes: a substrate; a switching device including a first gate structure, a second gate structure, a first doped region, a second doped region and a third doped region, in which the first gate structure and the second gate structure are arranged on the substrate, the first doped region and the second doped region are respectively located in the substrate at two sides of the first gate structure, and the second doped region and the third doped region are respectively located in the substrate at two sides of the second gate structure; and an anti-fuse device including a third gate structure and the third doped region, in which the second gate structure and the third gate structure are respectively located on the substrate at two sides of the third doped region, and each of the doped regions is configure to form a source or a drain. In this way, the switching device includes two gate structures and three doped regions, that is, two switching transistors are formed, so that when programming, the two switching transistors share high voltage at the same time, which avoids the problem that the switching device is avalanche broken down caused by a high voltage falling on the switching device after the anti-fuse device is broken down, and improves the reliability and stability of the switching device. In addition, the switching device includes three doped regions. Since voltage drop is present in the three doped regions when the switching device is turned on, the voltage in the second doped region is higher than that in the substrate, and because of the substrate bias effect, the turn-on voltage of the switching device increases, which further avoids the possibility of breakdown of the switching device.

In another embodiment of the disclosure, reference is made to FIG. 10, which shows a schematic diagram of the array arrangement of an anti-fuse array 400 provided by an embodiment of the disclosure. As shown in FIG. 10, on the basis of the composition of the anti-fuse structure described above, the anti-fuse structure 400 includes a plurality of anti-fuse sub-arrays and N bit lines.

The plurality of anti-fuse sub-arrays 41 are arranged extending along a first direction, in which each of the anti-fuse sub-arrays includes two anti-fuse unit rows 42, each of the anti-fuse unit rows 42 includes N anti-fuse structures 200 described in any of the preceding embodiments. N is an integer greater than or equal to 1. The two anti-fuse unit rows 42 are axially symmetrically arranged along a symmetry axis extending parallel to a second direction, the N anti-fuse structures 200 of each anti-fuse unit row 42 are spaced apart from each other along the second direction, and the first gate structures, the second gate structures and the third gate structures of the N anti-fuse structures 200 are respectively connected extending along the second direction.

The N bit lines extend along the first direction and spaced apart from each other along the second direction. Each of the bit lines is electrically connected to the first doped regions spaced apart from each other along the first direction in the plurality of anti-fuse sub-arrays 41.

It should be noted that, the anti-fuse array may include multiple anti-fuse sub-arrays arranged along the first direction. Two anti-fuse sub-arrays 41 are shown in FIG. 10. Each anti-fuse sub-array 41 includes two anti-fuse unit rows 42, and each anti-fuse unit row 42 includes N anti-fuse structures 200, in which the anti-fuse structures 200 may be the anti-fuse structure described in any of the preceding embodiments.

It should also be noted that, as shown in FIG. 10, in each anti-fuse sub-array 41, the two anti-fuse unit rows 42 are symmetrically arranged with respect to the symmetry axis pp' which extends in the second direction.

The first direction is defined as the column direction of the anti-fuse array 400 and the second direction is defined as the row direction of the anti-fuse array 400. In one row of the anti-fuse array 400, a plurality of anti-fuse structures 200 are sequentially spaced apart from each other to form an antifuse unit row 42. In one column of the anti-fuse array 400, a bit line 29 corresponds to a plurality of anti-fuse structures 200 in one column sequentially spaced apart from each other. In a column of the anti-fuse array 400, a bit line 29 is electrically connected to the first doped region of each anti-fuse structure 200 in the column.

In some embodiments, as shown in FIG. 10, in an anti-fuse unit row 42, the first gate structure and the second gate structure of at least one of the anti-fuse structures 200 located at the two ends in the second direction are connected with each other.

Figure 11:
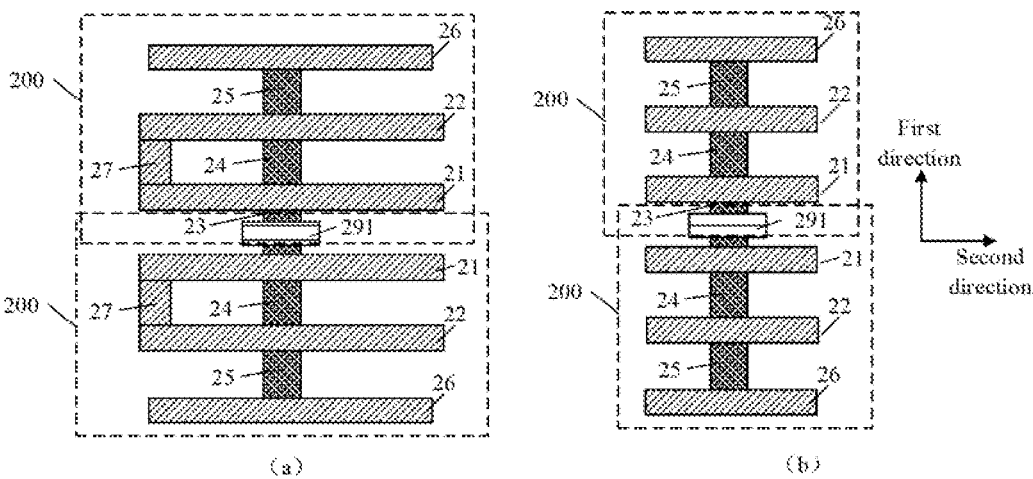
FIG. 11 is a partially enlarged schematic diagram of an anti-fuse array provided by an embodiment of the present disclosure.

It should be noted that, referring to FIG. 11, (a) and (b) in FIG. 11 show partially enlarged schematic diagrams of an anti-fuse array provided by an embodiment of the disclosure respectively. (a) shows a group of anti-fuse structures on the leftmost side of the anti-fuse sub-array 41 in FIG. 10, and (b) shows a group of anti-fuse structures in the middle of the anti-fuse sub-array 41 in FIG. 10. The meanings represented by reference numerals in FIG. 11 are the same as those described in the preceding embodiments and will not be repeated here.

As shown in FIG. 11, in the second direction, the first gate structure 21 and the second gate structure 22 of the first anti-fuse structure 200 in the anti-fuse unit row 42 are connected. Similarly, in the second direction, the first gate structure 21 and the second gate structure 22 of the last anti-fuse structure 200 in the anti-fuse unit row 42 may also be connected. For an anti-fuse structure 200 that is not the first or the last in the anti-fuse unit row 42, the first gate structure 21 and the second gate structure 22 may not be directly connected. However, it could be understood that, as shown in FIG. 10, in the anti-fuse array 400, a plurality of first gate structures included in an anti-fuse unit row 42 are connected with each other, a plurality of second gate structures are also connected with each other. Since the first gate structure and the second gate structure of the first and/or the last anti-fuse structures 200 are connected, all the first gate structures and the second gate structures in an anti-fuse unit row 42 are connected as a whole, and the whole serves as the first gate structure and the second gate structure of the anti-fuse unit row 42. That is, all the anti-fuse structures in an anti-fuse unit row 42 share the same first gate structure and the same second gate structure. That is, as shown in FIG. 10, the first gate structure 21 represents a first gate structure of one of the anti-fuse structures 200 in the anti-fuse unit row 42, and also represents the first gate structures of all the anti-fuse structures 200 in the anti-fuse unit row 42. It is the same for the second gate structure 22 and the third gate structure 26.

In some embodiments, in each anti-fuse unit row, the first gate structures and the second gate structures of the N anti-fuse structures are connected with each other and are bent or annular.

It should also be noted that, in an anti-fuse unit row 42, only the first gate structure 21 and the second gate structure 22 of the first or last anti-fuse structure 200 may be connected, to form a bent gate shared by all anti-fuse structures 200 in the anti-fuse unit row 42. That is, a plurality of bent gates are formed in the anti-fuse array. Both the first gate structures 21 and the second gate structures 22 of the first and last anti-fuse structures 200 may also be connected, to form an annular gate shared by all the anti-fuse structures 200 in one anti-fuse unit row 42. That is, a plurality of annular gates are formed in the anti-fuse array. In addition, the first gate structure(s) 21 and the second gate structure(s) 22 of one or more anti-fuse structures in an anti-fuse unit row 42 may be connected, or the first gate structure 21 and the second gate structure 22 of each anti-fuse structure may be connected in a bent type or in an annular type. It is not specifically limited herein.

When only the first gate structure and the second gate structure of the first or last anti-fuse structure are connected, the complexity of the layout of the anti-fuse array can be reduced, and the layout area can be reduced, which is beneficial to the actual process implementation. In addition, all the anti-fuse structures in an anti-fuse unit row 42 share a gate structure, which can also simplify the complexity of the layout and the process implementation difficulty.

In some embodiments, as shown in FIG. 10, in each of the anti-fuse unit rows, a spacing distance between the first doped regions, a spacing distance between the second doped regions, and a spacing distance between the third doped regions are all the same.

It should be noted that, in the embodiments of the disclosure, in the anti-fuse unit row 42, not only the spacing distances between adjacent gate structures (including the first gate structure, the second gate structure and the third gate structure) are the same, the spacing distances between the active areas (doped regions) of the anti-fuse structures 200 are also the same. More specifically, the spacing distances of adjacent first doped regions, the spacing distances of adjacent second doped regions and the spacing distances of adjacent third doped regions are the same. Accordingly, the spacing distances of adjacent bit lines 29 are also the same. Therefore, the layout of the anti-fuse array can be uniform, the layout area can be effectively saved, and the complexity of the manufacturing process for the anti-fuse array can be improved.

As shown in FIG. 10, in some embodiments, the spacing distances between the anti-fuse sub-arrays 41 in the first direction are the same.

It should be noted that, the spacing distances of adjacent anti-fuse sub-arrays 41 arranged along the first direction are also the same, so that the anti-fuse arrays can also be uniformly arranged.

As shown in FIG. 10, in some embodiments, in an anti-fuse sub-array 41, two adjacent and symmetrical anti-fuse structures 200 in the first direction share the same first doped region.

It should be noted that, as shown in FIG. 10 or FIG. 11, the anti-fuse sub-array 41 includes two anti-fuse unit rows 42 symmetrically arranged. In the column direction (the first direction) of the anti-fuse unit rows 42, the two anti-fuse structures 200 may be symmetrically arranged and share the same first doped region. In addition, each anti-fuse structure 200 further includes a bit line connecting structure 291 for electrically connecting the first doped region and the bit line 29. In one column of the anti-fuse array 400, a plurality of anti-fuse structures share a same bit line 29.

Figure 12:
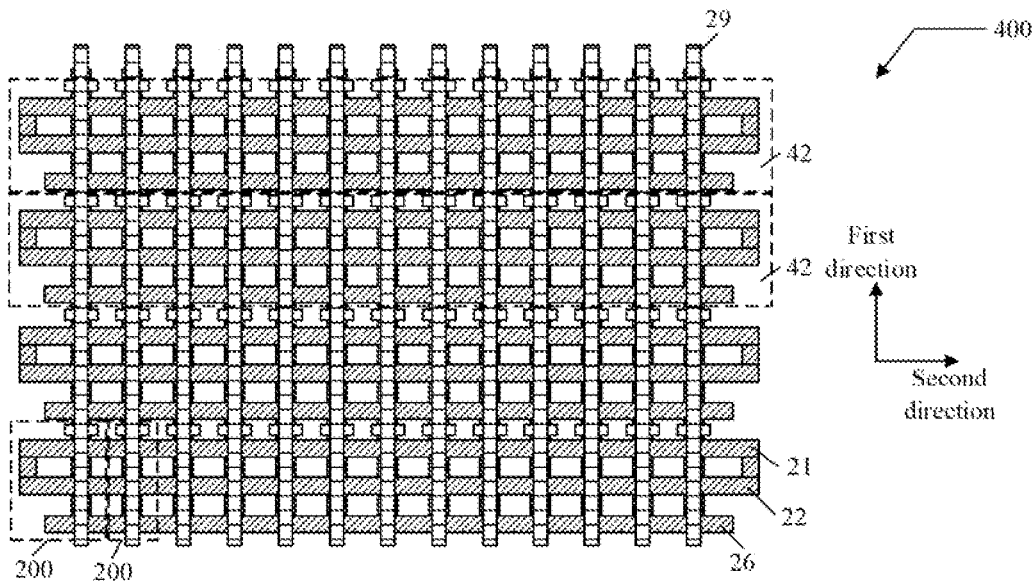
FIG. 12 is a schematic diagram of the array arrangement of another anti-fuse array provided by an embodiment of the disclosure.

It should also be noted that, the anti-fuse unit rows 42 may not be symmetrically arranged but may be arranged in sequence along the first direction. In this case the first doped region is not shared by the anti-fuse structures. Specifically, reference is made to FIG. 12, which shows a schematic diagram of the array arrangement of another anti-fuse array provided by an embodiment of the disclosure. As shown in FIG. 12, in the anti-fuse array 400, a plurality of anti-fuse unit rows 42 are sequentially arranged in the first direction. Each anti-fuse unit row 42 includes N anti-fuse structures 200. In each anti-fuse unit row, the connection mode between the first gate structures 21, the second gate structures 22, and the third gate structures 26, and the connection mode of the bit lines 29 are the same as that of the anti-fuse array described in FIG. 10, except that in FIG. 12, each anti-fuse unit independently includes one first doped region. The anti-fuse array is neat, beautiful, and the layout is also uniform, which can effectively prevent the parasitic effect and uneven doping of the anti-fuse array.

Technical details not disclosed in the embodiments of the disclosure may be understood with reference to the description of the preceding embodiments.

In a word, embodiments of the disclosure provide an anti-fuse array employing a double thin gate oxide device with a bent gate as a switching device without an anti-fuse doped region, in which the spacing distance between the gate structures of the anti-fuse device and the switching device is consistent. The anti-fuse array may be an array constructed with the anti-fuse structures shown in any of the aforementioned FIG. 3 to FIG. 8. The anti-fuse structure adopts a double thin gate oxide device with a bent gate as a switching device, which greatly reduces the length and width of the switching device; and the anti-fuse doped region is not provided in an area corresponding to the anti-fuse device, so that the distances between the active areas and the gate structures in the anti-fuse device and the switching device are consistent. The anti-fuse structure can be greatly shrunk in the width direction and simultaneously improved in the length direction.

Embodiments of the disclosure provide an anti-fuse array including a plurality of anti-fuse structures. A thin oxide can be used as the gate oxide layers of the selective device and the anti-fuse device in the anti-fuse structure, and the spacing distances between the active areas and the gate structures in the selective device and the anti-fuse device are consistent, so that the pattern uniformity of the anti-fuse array can be improved, and the uniformity of the anti-fuse structures can also be improved in the manufacturing of integrated circuits.

In yet another embodiment of the disclosure, reference is made to FIG. 13, which is a flow chart showing a method for manufacturing an anti-fuse array provided by an embodiment of the disclosure. As shown in FIG. 13, the method may include the following operations.

In S1001, a semiconductor substrate is provided, and a shallow trench isolation structure is formed on the semiconductor substrate.

It should be noted that, referring to FIG. 14, it is a schematic structural diagram of the substrate 10 provided by an embodiment of the disclosure. As shown in FIG. 14, a semiconductor substrate 20 is first provided for manufacturing the anti-fuse structure. In FIG. 14, (b) is a top view and (a) is a cross-sectional view in aa' direction of (b). Herein, the substrate 20 may be a silicon substrate or other suitable substrate material such as silicon, germanium, silicon-germanium compound, or the like, for example, a doped or undoped monocrystalline silicon substrate, a polysilicon substrate or the like, which is not specifically limited by the embodiments of the disclosure.

Figure 15:
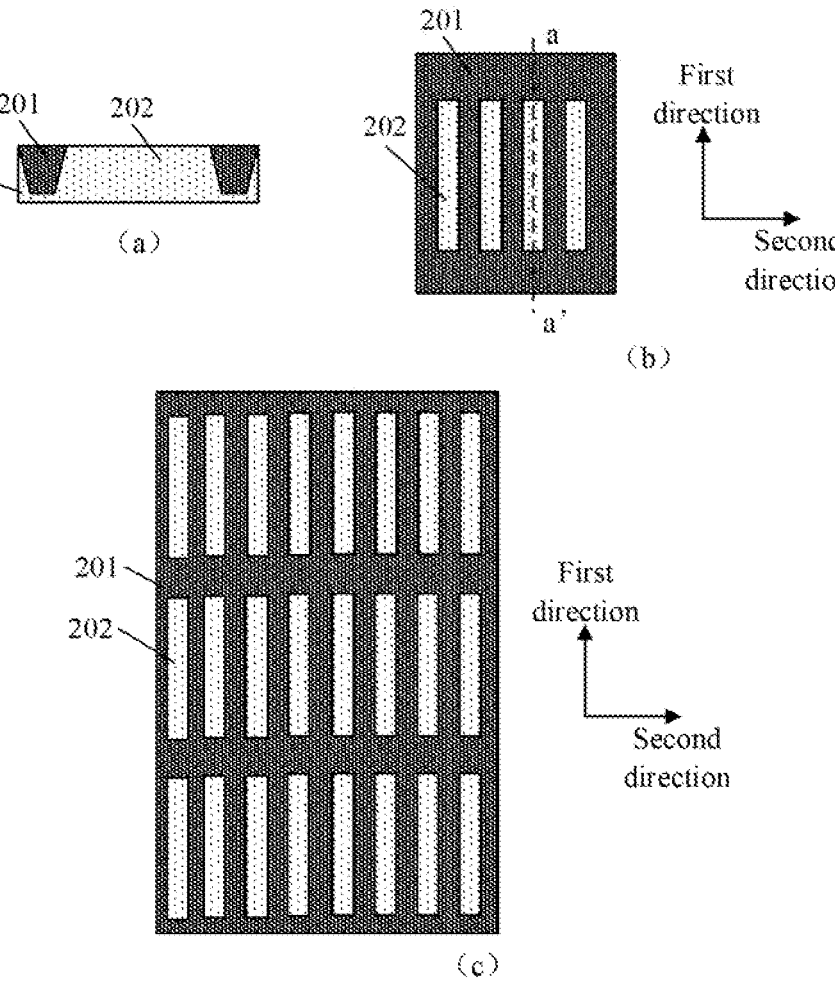
FIG. 15 is a schematic diagram of a structure obtained after forming a shallow trench isolation structure provided by an embodiment of the disclosure.

A shallow trench isolation (STI) is formed in the semiconductor substrate 20 to divide the semiconductor substrate 20 into a plurality of active areas, and the plurality of active areas are arranged in an array. Reference is made to FIG. 15, which shows a schematic diagram of a structure obtained after forming a shallow trench isolation structure provided by an embodiment of the disclosure. In FIG. 15, (b) is a top view, (a) is a cross-sectional diagram in aa' direction of (b), (c) is an layout diagram of an array of active areas, and (b) shows a part of (c), where the shallow trench isolation structure 201 divides the semiconductor substrate 20 into a plurality of active areas 202 spaced apart from each other. As shown in (a) of FIG. 15, the active area 202 has a grooved shape, and as shown in (b) of FIG. 15, the plurality of active areas 202 are spaced from each other in the second direction, and each active area 202 extends in the first direction.

As shown in (c) of FIG. 15, the shallow trench isolation structure 201 divides the substrate 20 into a plurality of active areas arranged in an array. In the first direction, the spacing distances between adjacent active areas 202 may be the same; in the second direction, the spacing distance between adjacent active areas 202 may be the same; and the sizes of the plurality of active areas 202 may be the same. The uniform arrangement of the anti-fuse array is not only beneficial to the process implementation, but also can effectively prevent the layout parasitic effect and uneven doping problem of the anti-fuse array. In the embodiment of the disclosure, a row of active areas in the second direction in the array (as shown in (b) of FIG. 15) is taken as an example for description.

In S1002, an initial gate layer is formed on the semiconductor substrate.

It should be noted that, an initial gate layer is formed on the semiconductor substrate for preparing gate structures. Before this, the active areas need to be doped. Thus, in some embodiments, before forming an initial gate oxide layer on the semiconductor substrate, the method may further include the following operations.

A well region is formed in the active area.

A channel layer is formed in the well region.

Figure 16:
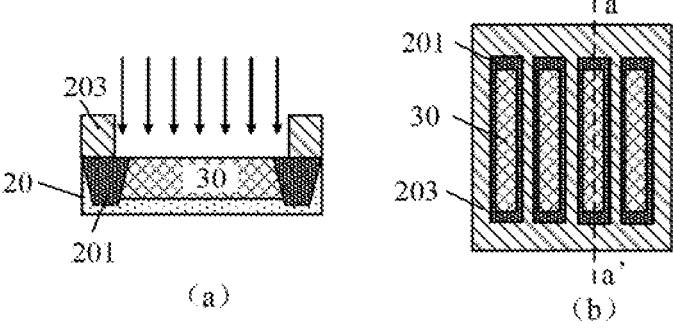
FIG. 16 is a schematic diagram of a structure obtained after forming a well region provided by an embodiment of the disclosure.
Figure 19:
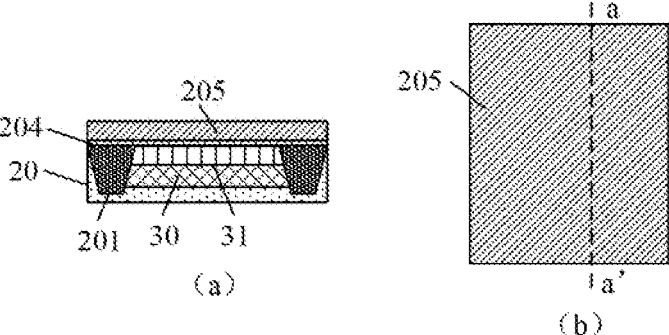
FIG. 19 is a schematic diagram of a structure obtained after forming an initial gate conductive layer provided by an embodiment of the disclosure.

It should be noted that, reference is made to FIG. 19, which shows a schematic diagram of a structure obtained after forming a well region 30 provided by an embodiment of the disclosure. In FIG. 16, (b) is a top view, and (a) is a cross-sectional diagram in aa' direction in (b). As shown in FIG. 16, before the active areas 202 are doped, a first photoresist layer 203 exposing the active areas 202 is first formed on the semiconductor substrate 20, and then the active areas 202 are doped (as indicated by the arrows in (a)) to form a well region 30. For example, the doping manner may be P-type ion implantation so that a P-well region 30 (P-Well, PW) can be obtained.

Figure 17:
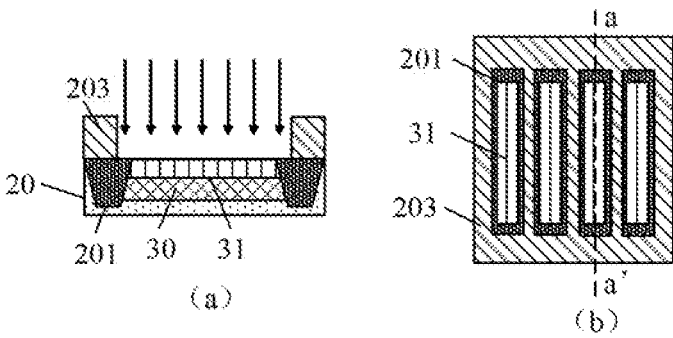
FIG. 17 is a schematic diagram of a structure obtained after forming a channel layer provided by an embodiment of the disclosure.

The well region 30 is continued to be doped to form a channel layer. Reference is made to FIG. 17, which shows a schematic diagram of a structure obtained after forming a channel layer 31 provided by an embodiment of the disclosure. In FIG. 17, (b) is a top view, and (a) is a cross-sectional diagram in aa' direction in (b). As shown in FIG. 17, the well region 30 is doped (as indicated by the arrows in (a)) and a channel layer 31 is formed in the well region 30. For example, the doping manner may be P-type ion implantation so that a P-type channel layer 31 may be obtained, in which the doping concentration of the channel layer 31 may be higher than that of the well region 30.

At this time, the well region 30 and the channel layer 31 are formed in the active areas of the semiconductor substrate 20. The first photoresist layer 203 is removed, and then an initial gate layer is formed.

In some embodiments, the forming of the initial gate layer on the semiconductor substrate may include the following operations.

An initial gate oxide layer is formed on the semiconductor substrate.

An initial gate conductive layer is formed on the initial gate oxide layer.

Figure 18:
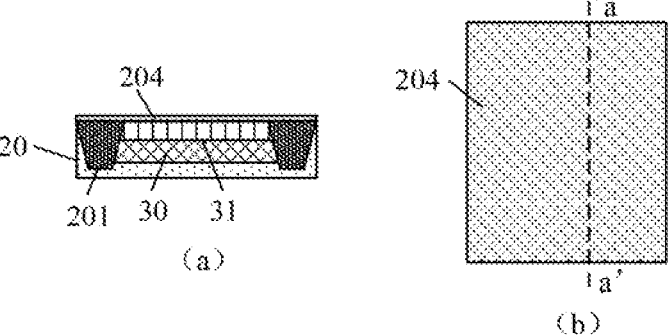
FIG. 18 is a schematic diagram of a structure obtained after forming an initial gate oxide layer provided by an embodiment of the disclosure.

It should be noted that, reference is made to FIG. 18, which shows a schematic diagram of a structure obtained after forming an initial gate oxide layer 204 provided by an embodiment of the disclosure. In FIG. 18, (b) is a top view, and (a) is a cross-sectional diagram in aa' direction in (b). As shown in FIG. 18, an initial gate oxide layer 204 is formed on the semiconductor substrate 20 covering the shallow trench isolation structure 201 and the channel layer 31.

Herein, the initial gate oxide layer 204 may be formed by deposition and the material of the initial gate oxide layer 204 may include silicon dioxide or the like.

An initial gate conductive layer 205 is formed on the initial gate oxide layer 204. Reference is made to FIG. 19, which shows a schematic diagram of a structure obtained after forming an initial gate conductive layer 205 provided by an embodiment of the disclosure. In FIG. 19, (b) is a top view, and (a) is a cross-sectional diagram in aa' direction in (b). As shown in FIG. 19, the initial gate conductive layer 205 is formed on the whole initial gate oxide layer 204. Herein, the initial gate conductive layer 205 may be formed by deposition and the material of the initial gate conductive layer 205 may include polysilicon or the like. That is, the initial gate layer is composed of an initial gate oxide layer 204 and an initial gate conductive layer 205 formed on the initial gate oxide layer 204.

Figure 20:
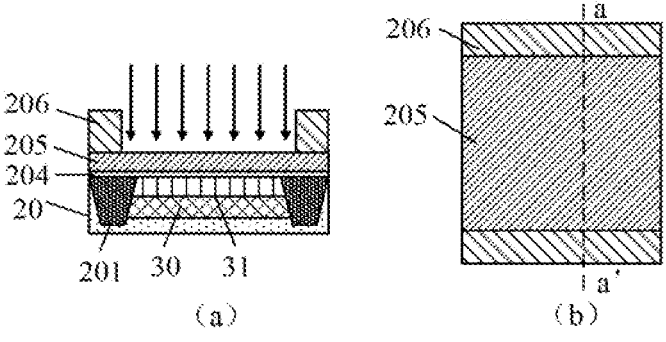
FIG. 20 is a doping schematic diagram of the doping of the gate conductive layer provided by an embodiment of the disclosure.

The gate conductive layer is doped. Reference is made to FIG. 20, which shows a doping schematic diagram of the doping of the gate conductive layer 205 provided by an embodiment of the disclosure. In FIG. 20, (b) is a top view, and (a) is a cross-sectional diagram in aa' direction in (b). As shown in FIG. 20, when doping the gate conductive layer 205, a second photoresist layer 206 exposing the gate conductive layer 205 for subsequent formation of the gate structure on each active area is first formed on the gate conductive layer 205, and the exposed gate conductive layer 205 is doped (as indicated by the arrows in (a)). Herein, for example, the doping manner may be N-type ion implantation, so that an N-type doped polysilicon gate (N-Gate, NGA) can be obtained.

The second photoresist layer 206 is then removed, so that the initial gate layer consisting of an initial gate oxide layer 204 and a doped initial gate conductive layer 205 is obtained.

In S1003, the initial gate layer is patterned to form a plurality of groups of gate structures on the plurality of active areas.

It should be noted that, the initial gate layer is patterned, to remove part of the initial gate layer, and the remaining initial gate layer forms a plurality of gate structures. Herein, referring to (c) of FIG. 15, a group of gate structures (or groups of gate structures) may be formed on a row of active areas in the second direction. For example, as shown in (b) of FIG. 15, gate structures are formed on the four active areas spaced apart from each other in the second direction as a minimum unit. Or, all active areas spaced apart from each other in the second direction can be taken as a minimum unit to form gate structures on the active areas. This is specifically set in combination with actual process conditions and requirements, and the embodiments of the disclosure are not specifically limited thereto.

The initial gate layer is patterned, so that the initial gate layer is divided into a plurality of groups of gate structures, in which one group of gate structures corresponds to an anti-fuse sub-array in the aforementioned embodiments. Therefore, corresponding to the anti-fuse sub-array, each group of gate structures is symmetrically arranged. Specifically, each group of gate structures includes a pair of first gate structures symmetrically arranged on both sides of a symmetry axis, a pair of second gate structures symmetrically arranged on both sides of the pair of first gate structures, and a pair of third gate structures symmetrically arranged on both sides of the pair of second gate structures, and the symmetry axis, the first gate structures, the second gate structures and the third gate structures respectively extend along the second direction, and each group of gate structures covers a plurality of the active areas arranged along the second direction.

In some embodiments, the patterning of the initial gate layer may include the following operation.

A mask layer is formed on the initial gate layer, in which the mask layer includes at least one sub-mask layer, and the sub-mask layer includes a first portion, a second portion, a third portion and a fourth portion spaced apart from each other along the first direction, the first portion and the fourth portion are symmetrically arranged and are linear, and the second portion and the third portion are symmetrically arranged and are bent or annular.

The initial gate layer is patterned with the mask layer as a mask to remove part of the initial gate conductive layer and part of the gate oxide layer, in which the initial gate layer retained below the first portion and the fourth portion forms a pair of third gate structures, and the initial gate layer retained below the second portion and the third portion forms a pair of first gate structures and a pair of second gate structures.

The mask layer is removed.

Figure 21:
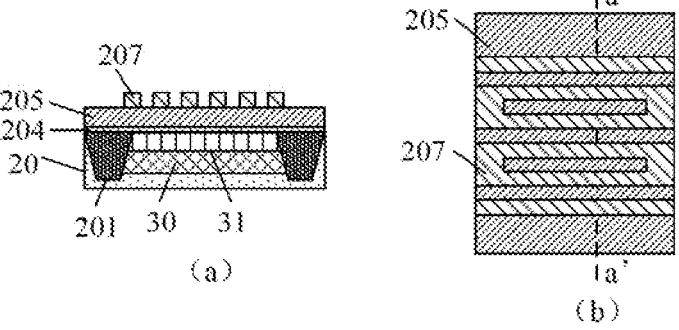
FIG. 21 is a schematic diagram of a structure obtained after forming a mask layer provided by an embodiment of the disclosure.

It should be noted that, referring to FIG. 21, it shows a schematic diagram of a structure obtained after forming a mask layer provided by an embodiment of the disclosure. In FIG. 21, (b) is a top view, and (a) is a cross-sectional diagram in aa' direction in (b). As shown in (a) of FIG. 21, a sub-mask layer 207 is formed on the initial gate conductive layer 205, and the material of the sub-mask layer 207 may be the same as that of the first photoresist layer 203 and the second photoresist layer 206 described above, and is also photoresist (PR).

It should also be noted that, FIG. 21 shows a sub-mask layer 207 for forming a group of gate structures. The mask layer is composed of at least one group of sub-mask layers 207, so that a plurality of groups of gate structures can be formed. Here one sub-mask layer 207 is just taken as an example.

Figure 22:
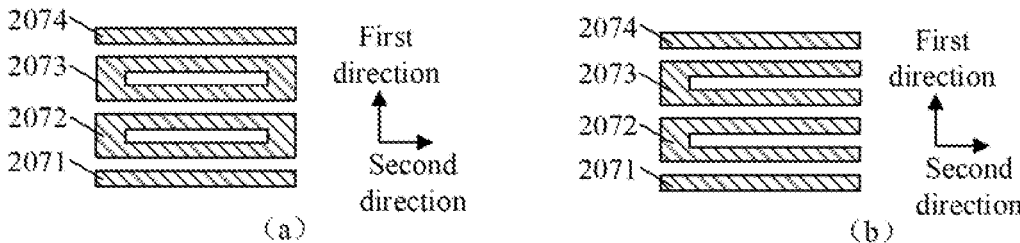
FIG. 22 is schematic diagrams of specific structures of two mask layer provided by embodiments of the disclosure.

Specifically, reference is made to FIG. 22, which shows schematic diagrams of specific structures of two sub-mask layer provided by embodiments of the disclosure. As shown in (a) and (b) of FIG. 22, the sub-mask layer 207 may include a first portion 2071, a second portion 2072, a third portion 2073, and a fourth portion 2074 arranged at intervals along the first direction, and all of the first portion 2071, the second portion 2072, the third portion 2073 and the fourth portion 2074 extend along the second direction. The first portion 2071 and the fourth portion 2074 are all linear. In one implementation, as shown in (a) of FIG. 22, both the second portion 2072 and the third portion 2073 are annular. In another implementation, as shown in (b) of FIG. 22, both the second portion 2072 and the third portion 2073 are bent (or U-shaped).

It should also be noted that, along the first direction, the first portion 2071, the fourth portion 2074, the left and right portions of the second portion 2072 and the left and right portions of the third portion 2073 have the same width and spacing distance. In addition, both FIG. 21 and FIG. 22 show only one sub-mask layer 207. For the anti-fuse array as a whole, the sub-mask layer composed of the first portion, the second portion, the third portion and the fourth portion should be repeatedly arranged along the first direction for forming the gate structures of the anti-fuse array.

Figure 23:
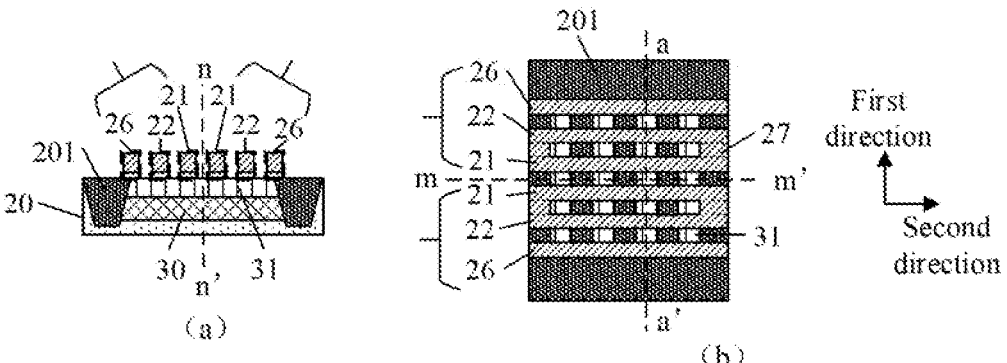
FIG. 23 is a schematic diagram of a structure obtained after patterning the initial gate layer provided by an embodiment of the disclosure.

The initial gate layer is patterned with the mask layer as a mask to remove the initial gate layer exposed by the mask layer. Reference is made to FIG. 23, which shows a schematic diagram of a structure obtained after patterning the initial gate layer provided by an embodiment of the disclosure. In FIG. 23, (b) is a top view, and (a) is a cross-sectional diagram in aa' direction in (b). After the pattern is transferred and the mask layer is removed, gate structures are formed. As shown in (a) of FIG. 23, the gate structures are separated into left and right portions shown with braces. The left portion of the gate structures includes the third gate structure 26 formed by the gate layer remaining below the first portion 2071, and the first gate structure 21 and the second gate structure 22 formed by the gate layer remaining below the second portion 2072. The right portion of the gate structures includes the third gate structure 26 formed by the gate layer remaining below the fourth portion 2074, and the first gate structure 21 and the second gate structure 22 formed by the gate layer remaining below the third portion 2073. Herein, the gate structures are symmetrically arranged along a symmetry axis extending parallel to the second direction. In (a), the symmetry axis is shown as nn', and in (b), the symmetry axis is shown as mm'. Moreover, the distance between the gate structures and the width of the gate structures are the same, respectively.

As shown in (b) of FIG. 23, the gate structures are formed on each channel layer 31. The gate structures are separated into two portions shown with braces. Herein, for the left half or the right half of one group of gate structures, in the second direction, a plurality of first gate structures 21 formed on a plurality of the channel layers 31 are connected with each other and extend in the second direction, a plurality of second gate structures 22 formed on a plurality of the channel layers 31 are connected with each other and extend in the second direction, and a plurality of third gate structures 26 formed on a plurality of the channel layers 31 are connected with each other and extend in the second direction. In addition, based on the annular (or bent) topography of the sub-mask layer 207, after the pattern is transferred, in each group of gate structures, the first gate structures 21 are connected with the second gate structures 22 in the left half, and the first gate structures 21 are also connected with the second gate structures 22 in the right half, and the connecting part between the first gate structure 21 and the second gate structure 22 is referred to here as a gate connecting structure 27.

In S1004, a plurality of first doped regions are formed in the active areas between the first gate structures, a plurality of second doped regions are formed in the active areas between the first gate structure and the second gate structure adjacent thereto, and a plurality of third doped regions are formed in the active areas between the second gate structure and the third gate structure adjacent thereto.

It should be noted that, the active areas between the gate structures is doped to form doped regions.

In some embodiments, before forming the first doped regions in the active areas between the first gate structures, the method further includes the following operations.

First protective layers are formed on sidewalls of the first gate structures, the second gate structures and the third gate structures.

Lightly doped drain regions are formed at the junctions of the first protective layers and the channel layer.

Second protective layers are formed on sidewalls of the first protective layers.

Figure 24:
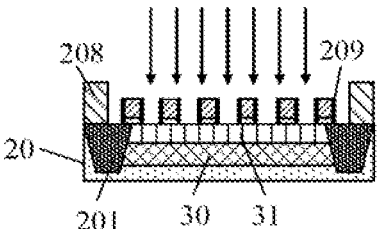
FIG. 24 is a schematic diagram of a structure obtained after forming first protective layers provided by an embodiment of the disclosure.

It should be noted that, reference is made to FIG. 24, which shows a schematic diagram of a structure obtained after forming first protective layers 209 provided by an embodiment of the disclosure. As shown in FIG. 24, first protective layers 209 (the first protective layer may be abbreviated to as LSE) are formed on the sidewalls of each of the first gate structure, the second gate structure, and the third gate structure, and a third photoresist layer 208 exposing each of the gate structures is formed on the semiconductor substrate 20. Then, lightly doped drain regions (not shown in FIG. 24) are formed in the channel layer 31 with the first protective layers 209 as a protection. The lightly doped drain regions are formed at the junctions of the channel layer 31 and the first protective layers 209. The specific position the formed lightly doped drain regions can refer to the aforementioned FIG. 8. The form of the lightly doped drain regions can be ion implantation.

Figure 25:
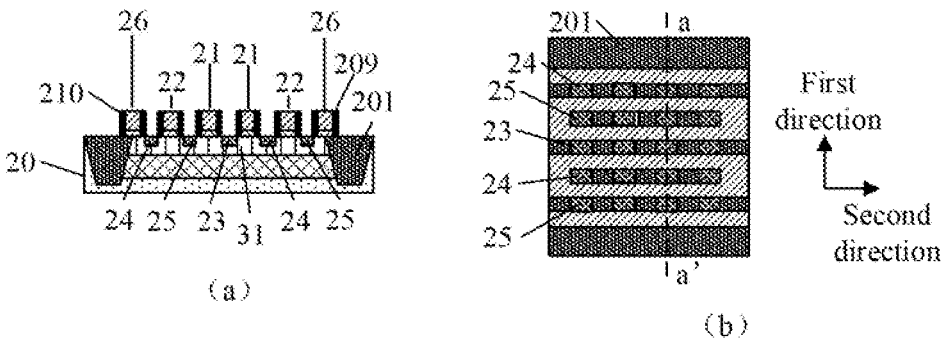
FIG. 25 is a schematic diagram of a structure obtained after forming doped regions provided by an embodiment of the disclosure.

Next, second protective layers 210 are formed on sidewalls of the first protective layers 209 and the channel layer 31 is doped with the second protective layers 210 as a protection to form a plurality of doped regions. Reference is made to FIG. 25, which shows a schematic diagram of a structure obtained after forming doped regions provided by an embodiment of the disclosure. In FIG. 25, (b) is a top view, and (a) is a cross-sectional diagram in aa' direction in (b). As shown in FIG. 25, the second protective layers 210 are formed on the sidewalls of the first protective layers 209 and the doped regions are formed in the channel layer 31 between the second protective layers 210 (the first protective layers and the second protective layers are not shown in (b)). Herein, the doped region formed between the first gate structures 21 is the first doped region 23, the doped region formed between the first gate structure 21 and the second gate structure 22 is the second doped region 24, and the doped region formed between the second gate structure 22 and the third gate structure 26 is the third doped region 25.

That is, the first doped region, the second doped region, and the third doped region are formed in the active area between the second protective layers 210, and the first gate structure 21, the second gate structure 22, and the third gate structure 26 are all formed on the active area. Herein, the widths of the first doped region, the second doped region and the third doped region are the same. In addition, the doping depth of each doping region may be smaller than, or larger than, or may be equal to the depth of the channel layer 31, which is not specifically limited here.

In some embodiments, the first gate structure and the second gate structure form the gates of a switching device and the third gate structure forms the gate of an anti-fuse device.

It should be noted that, the method provided by the embodiments of the disclosure is used for manufacturing the anti-fuse array described in the preceding embodiments. That is, a plurality of anti-fuse devices and switching devices can be thus manufactured, in which the first gate structure and the second gate structure are connected to form the gate of the switching device, and the third gate structure forms the gate of the anti-fuse device. Moreover, a plurality of anti-fuse devices and a plurality of switching devices share one group of gate structures. The first doped region forms a source shared by two symmetrical switching devices, each of the two symmetrical switching devices independently includes a second doped region and a third doped region, in which the second doped region forms a second drain of the switching device and the third doped region forms a first drain of the switching device.

Technical details not disclosed in the embodiments of the disclosure may be understood with reference to the description of the preceding embodiments.

The embodiments of the disclosure provide a method for manufacturing an anti-fuse structure described in the preceding embodiment. The anti-fuse array manufactured by the method has a uniform arrangement of anti-fuse structures, which effectively prevents layout parasitic effect and uneven doping problem of the anti-fuse array. The switching devices in the anti-fuse array are not easy to be broken down, and have good reliability and stability. In addition, since the switching device and the anti-fuse device are both double thin gate oxide devices, the gate structures of the switching device and the anti-fuse device can be manufactured at the same time only by one process, and the process is not necessarily to be repeated, and therefore not only simplifies the process, but also saves the cost and improves the uniformity of the anti-fuse array.

Figure 26:
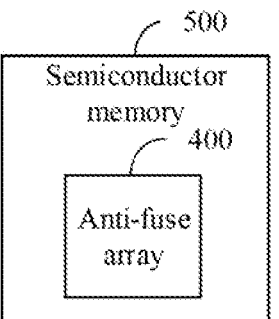
FIG. 26 is a schematic diagram of the composition of a semiconductor memory provided by an embodiment of the disclosure.

In yet another embodiment, referring to FIG. 26, it is a schematic diagram of the composition of a semiconductor memory 500 provided by an embodiment of the disclosure. As shown in FIG. 26, the semiconductor memory 500 includes the anti-fuse array 400 described in any one of the preceding embodiments.

Since the semiconductor memory 500 includes the aforementioned anti-fuse array 400, the area of the anti-fuse array 400 is small, so that the integration of the semiconductor memory 500 can be improved, the storage capacity of the semiconductor memory can be effectively increased, and the performance of the semiconductor memory can be improved.

The description above is only preferred embodiments of the disclosure, and is not intended to limit the protection scope of the present disclosure.

It should be noted that, in the disclosure, the terms "including", "comprising" or any other variation thereof are intended to encompass non-exclusive inclusion, so that a process, a method, an article or a device that includes a set of elements includes not only those elements but also other elements that are not explicitly listed, or also elements inherent to such a process, method, article or device. In the absence of further limitations, an element defined by the phrase "includes a/an . . . " does not exclude the existence of another identical element in the process, method, article or device in which the elements is included.

The above serial numbers of the embodiments of the present disclosure are for description only and do not represent the advantages and disadvantages of the embodiments.

The method disclosed in the embodiments of several methods provided in the disclosure can be arbitrarily combined as long as there is no conflict therebetween to obtain a new embodiment of a method.

The features disclosed in the embodiments of several products provided in the disclosure can be arbitrarily combined as long as there is no conflict therebetween to obtain a new embodiment of a product.

The features disclosed in the embodiments of several methods or devices provided in the disclosure can be arbitrarily combined as long as there is no conflict therebetween to obtain a new embodiment of a method or a device.

The descriptions above are only some specific embodiments of the present disclosure, and are not intended to limit the scope of protection of the embodiments of the present disclosure. Any change and replacement is easily to think within the technical scope of the embodiments of the present by those skilled in the art, and fall with the protection scope of the present disclosure. Therefore, the scope of protection of the embodiments of the present disclosure shall be subject to the scope of protection of the claims.

INDUSTRIAL PRACTICALITY

Embodiments of the disclosure provide an anti-fuse structure, an anti-fuse array and a method for forming the same.

The anti-fuse structure includes a substrate, a switching device and an anti-fuse device. The switching device includes a first gate structure, a second gate structure, a first doped region, a second doped region and a third doped region, in which the first gate structure and the second gate structure are arranged on the substrate, the first doped region and the second doped region are respectively located in the substrate on both sides of the first gate structure, and the second doped region and the third doped region are respectively located in the substrate on both sides of the second gate structure. The anti-fuse device includes a third gate structure and the third doped region, in which the second gate structure and the third gate structure are respectively located on the substrate on both sides of the third doped region. The doped regions are used for forming a source or a drain. In this way, the switching device includes two gate structures and three doped regions, that is, two switching transistors are provided. As such, when programming, the two switching transistors share high voltage at the same time, which avoids the problem that the switching device is avalanche broken down caused by a high voltage applied to the switching device after the anti-fuse device is broken down. In addition, the switching device includes three doped regions. The voltage in the second doped region is higher than that in the substrate due to the voltage drop in the three doped regions when the switching device is turned on, and the turn-on voltage of the switching device increases due to the substrate bias effect, which further avoids the possibility of breakdown of the switching device.

The invention claimed is:

1. An anti-fuse structure, comprising:
   a substrate;
   a switching device comprising a first gate structure, a second gate structure, a first doped region, a second doped region and a third doped region; the first gate structure and the second gate structure being arranged on the substrate, the first doped region and the second doped region being respectively located in the substrate at two sides of the first gate structure, and the second doped region and the third doped region being respectively located in the substrate at two sides of the second gate structure; and
   an anti-fuse device comprising a third gate structure and the third doped region, the second gate structure and the third gate structure being respectively located on the substrate at two sides of the third doped region, wherein the doped regions are respectively configured to form a source or a drain;
   wherein the first gate structure is connected with the second gate structure to form a bent gate or an annular gate.

2. The anti-fuse structure of claim 1, wherein
   a spacing distance between the first gate structure and the second gate structure is the same as a spacing distance between the second gate structure and the third gate structure.

3. The anti-fuse structure of claim 1, wherein
   the first gate structure comprises a first gate conductive layer and a first gate oxide layer, the second gate structure comprises a second gate conductive layer and a second gate oxide layer, and the third gate structure comprises a third gate conductive layer and a third gate oxide layer, wherein,
   the first gate oxide layer is provided between the first gate conductive layer and the substrate;
   the second gate oxide layer is provided between the second gate conductive layer and the substrate; and the third gate oxide layer is provided between the third gate conductive layer and the substrate.

4. The anti-fuse structure of claim 3, wherein thicknesses of the first gate oxide layer, the second gate oxide layer and the third gate oxide layer are the same.

5. The anti-fuse structure of claim 1, wherein the first doped region is a source of the switching device; the second doped region and the third doped region are a first drain and a second drain of the switching device, respectively.

6. The anti-fuse structure of claim 1, further comprising lightly doped drain regions, wherein the lightly doped drain regions are provided at two sides of the first doped region, at two sides of the second doped region and at two sides of the third doped region, respectively.

7. The anti-fuse structure of claim 1, further comprising:
a word line, wherein the word line is electrically connected with the first gate structure and the second gate structure; and
a bit line connecting structure that electrically connects a bit line to the first doped region.

8. The anti-fuse structure of claim 1, wherein the substrate is provided with a well region, wherein the first doped region, the second doped region and the third doped region are provided in the well region; and the first gate structure, the second gate structure and the third gate structure are provided on the well region.

9. An anti-fuse array, comprising:
multiple anti-fuse sub-arrays arranged along a first direction, wherein each of the anti-fuse sub-arrays comprises two anti-fuse unit rows, each of the anti-fuse unit rows comprises N anti-fuse structures according to claim 1, where N is an integer greater than or equal to 1; the two anti-fuse unit rows are axially symmetrically arranged along a symmetry axis extending parallel to a second direction, the N anti-fuse structures of each anti-fuse unit row are spaced apart from each other along the second direction, and the first gate structures, the second gate structures and the third gate structures of the N anti-fuse structures are respectively connected and extend along the second direction; and
N bit lines extending along the first direction and spaced apart from each other along the second direction, wherein each of the bit lines is electrically connected to the first doped regions spaced apart from each other along the first direction in the multiple anti-fuse sub-arrays.

10. The anti-fuse array of claim 9, wherein
in each of the anti-fuse unit rows, the first gate structure and the second gate structure of at least one of two anti-fuse structures located at two ends in the second direction are connected.

11. The anti-fuse array of claim 10, wherein
in each of the anti-fuse unit rows, the first gate structures and the second gate structures of the N anti-fuse structures are connected and are bent or annular.

12. The anti-fuse array of claim 9, wherein
in each of the anti-fuse unit rows, a spacing distance of adjacent first doped regions, a spacing distance of adjacent second doped regions, and a spacing distance of adjacent third doped regions are all the same.

13. The anti-fuse array of claim 9, wherein
the anti-fuse sub-arrays are all spaced at a same spacing distance in the first direction.

14. The anti-fuse array of claim 9, wherein
in the anti-fuse sub-array, two adjacent and symmetrical ones of the anti-fuse structures in the first direction share the first doped region.

15. An anti-fuse structure, comprising:
a substrate;
a switching device comprising a first gate structure, a second gate structure, a first doped region, a second doped region and a third doped region; the first gate structure and the second gate structure being arranged on the substrate, the first doped region and the second doped region being respectively located in the substrate at two sides of the first gate structure, and the second doped region and the third doped region being respectively located in the substrate at two sides of the second gate structure;
an anti-fuse device comprising a third gate structure and the third doped region, the second gate structure and the third gate structure being respectively located on the substrate at two sides of the third doped region, wherein the doped regions are respectively configured to form a source or a drain;
a word line, wherein the word line is electrically connected with the first gate structure and the second gate structure; and
a bit line connecting structure that electrically connects a bit line to the first doped region.

* * * * *